(12) United States Patent
Kim (10) Patent No.: US 8,966,749 B2
(45) Date of Patent: Mar. 3, 2015

(54) MANUFACTURING METHOD FOR PROTECTION CIRCUIT MODULE OF SECONDARY BATTERY

(75) Inventor: Bong Young Kim, Suwon-si (KR)

(73) Assignee: Samsung SDI Co., Ltd., Suwon-Si, Gyeonggi-Do (KR)

(*) Notice: Subject to any disclaimer, the term of this patent is extended or adjusted under 35 U.S.C. 154(b) by 1495 days.

(21) Appl. No.: 12/510,143

(22) Filed: Jul. 27, 2009

(65) Prior Publication Data

US 2010/0101081 A1    Apr. 29, 2010

Related U.S. Application Data

(60) Provisional application No. 61/109,094, filed on Oct. 28, 2008.

(51) Int. Cl.
*H05K 3/30*    (2006.01)
*H01L 23/00*    (2006.01)
(Continued)

(52) U.S. Cl.
CPC ............ *H01L 24/85* (2013.01); *H01L 21/6835* (2013.01); *H01L 24/48* (2013.01); *H05K 3/007* (2013.01); *H01L 24/28* (2013.01); *H01L 24/45* (2013.01); *H01L 2224/2919* (2013.01); *H01L 2224/29198* (2013.01); *H01L 2224/45144* (2013.01); *H01L 2224/45147* (2013.01); *H01L 2224/48091* (2013.01); *H01L 2224/48227* (2013.01); *H01L 2224/484* (2013.01); *H01L 2224/48599* (2013.01); *H01L 2224/83192* (2013.01); *H01L 2224/85001* (2013.01);
(Continued)

(58) Field of Classification Search
CPC ..... H01L 21/6835; H01L 24/48; H01L 24/85; H05K 3/007
USPC ................... 29/830–832, 834, 840, 841, 411; 174/254, 259, 260; 156/233; 269/903; 361/749, 777
See application file for complete search history.

(56) References Cited

U.S. PATENT DOCUMENTS 5,937,512 A * 8/1999 Lake et al. ...................... 29/832
6,437,985 B1 * 8/2002 Blanc et al. .................... 361/749
7,107,672 B2 * 9/2006 Onitsuka et al. ................ 29/832

FOREIGN PATENT DOCUMENTS

JP    06-029015    2/1994
JP    06029015 A    4/1994
(Continued)

OTHER PUBLICATIONS

Office Action dated Mar. 22, 2011 for corresponding Korean Patent Application No. 10-2009-0099556.
(Continued)

*Primary Examiner* — Donghai D Nguyen
(74) *Attorney, Agent, or Firm* — Knobbe Martens Olson & Bear LLP (57) ABSTRACT

A manufacturing method for a protection circuit module of a secondary battery is disclosed. The method includes mounting a die type circuit device to an FPCB. The mounting of the circuit device includes bonding the circuit device to the FPCB by wire bonding. The method may further include forming a protective layer on the FPCB to cover the circuit device. The protective layer may be formed by coating insulation resin on the FPCB.

15 Claims, 6 Drawing Sheets

(51) Int. Cl.
*H01L 21/683* (2006.01)
*H05K 3/00* (2006.01)
*H05K 3/28* (2006.01)

(52) U.S. Cl.
CPC .................. *H01L 2224/85444* (2013.01); *H01L 2924/01004* (2013.01); *H01L 2924/01014* (2013.01); *H01L2924/01029* (2013.01); *H01L 2924/01047* (2013.01); *H01L 2924/01078* (2013.01); *H01L 2924/01079* (2013.01); *H01L 2924/01082* (2013.01); *H01L 2924/14* (2013.01); *H01L 2924/19041* (2013.01); *H01L 2924/19043* (2013.01); *H05K 3/0052* (2013.01); *H05K 3/284* (2013.01); *H05K 3/305* (2013.01); *H05K 2203/016* (2013.01); *H05K 2203/049* (2013.01); *H01L 2924/00014* (2013.01); *H01L 2924/01006* (2013.01); *H01L 2924/01033* (2013.01); *H01L 2224/2929* (2013.01); *H01L 2224/293* (2013.01); *H01L 2924/01015* (2013.01)
USPC ............................... 29/841; 29/832; 174/260

(56) References Cited

FOREIGN PATENT DOCUMENTS

| | | |
|---|---|---|
| JP | 2001-143672 | 5/2001 |
| JP | 2001-203243 | 7/2001 |
| JP | 2001-268808 | 9/2001 |
| JP | 2007-049098 | 2/2007 |
| KR | 6041955 A | 5/2006 |

OTHER PUBLICATIONS

Notice of Allowance dated Oct. 26, 2011 for corresponding KR Application No. 10-2009-0099556.

\* cited by examiner

MANUFACTURING METHOD FOR PROTECTION CIRCUIT MODULE OF SECONDARY BATTERY

RELATED APPLICATIONS

This application claims the benefit of U.S. Provisional Application Ser. No. 61/109094, entitled PROTECTION CIRCUIT MODULE OF SECONDARY BATTERY AND MANUFACTURING FOR THE SAME, filed Oct. 28, 2008 which is hereby incorporated by reference in its entirety.

BACKGROUND OF THE INVENTION

1. Field of the Invention

The present invention relates to a secondary battery, and more particularly to, a manufacturing method for a protection circuit module of a secondary battery.

2. Description of the Related Art

In recent years, due to rapid development of electronics, communication and computer industries, portable electronic devices are being widely distributed. Rechargeable secondary batteries are being mainly used as power sources of portable electronic devices.

Secondary batteries including protection circuit modules (PCM) controlling charge and discharge thereof are being widely used. Recently, portable electronic devices using secondary batteries as main power sources are becoming rapidly miniaturized. Accordingly, the secondary batteries used in such portable electronic devices need to be miniaturized further. An existing PCM is manufactured by which various circuit devices are mounted on a printed circuit board (PCB). However, since the thickness of the PCB is at least 0.5 mm, there is a limit in obtaining a thinner PCM by an existing manufacturing method.

BRIEF SUMMARY OF THE INVENTION

The present invention has been made in view of the above problems, and the present invention provides a manufacturing method for a thin protection circuit module of a secondary battery.

The present invention also provides a manufacturing method for a thin protection circuit module of a secondary battery for safely protecting circuit devices.

The above-mentioned structures can accomplish all the above-mentioned aspects of the present invention. More particularly, since the above-mentioned method includes the step of mounting circuit devices on a flexible printed circuit board (hereinafter, referred to as 'FPCB'), the PCM can be made thinner. Furthermore, since a circuit device is protected by a molded portion, insulation is improved and damage to a circuit by an external impact is reduced.

In one embodiment, the method of forming a plurality of protection circuit modules (PCMs) for a battery comprises positioning a flexible printed circuit board (FPCB) on a fixing surface wherein the FPCB includes a plurality of unit pattern forming regions that each define a main body and an external terminal, positioning die-type chip circuit devices on the main body of the unit pattern forming regions of the FPCB so that a plurality of PCMs can be formed on the FPCB, positioning a protective layer over at least a portion of the FPCB so as to cover at least some of the components of the PCMs formed on the FPCB, and separating the FPCB from the fixing surface after the die-type circuit devices and protective layer has been positioned on the FPCB so as to separate a plurality of individual PCMs from the fixing surface.

In another embodiment, the method of forming a protection circuit module of a secondary battery comprises positioning at least one flexible printed circuit board (FPCB) having a main body and at least one external terminal on a fixing member, positioning one or more circuit devices in the form of die-type chips necessary for the protection circuit module (PCM) on to the main body of the at least one FPCB, connecting internal terminals to the at least one FPCB wherein the internal terminals are adapted to be connected to one or more electrodes of a bare cell supplying electrical energy, positioning a protective layer over at least a portion of the at least one FPCB so as to cover at least some of the PCM circuit devices, and separating the at least one FPCB with the one or more circuit devices and the protective layer from the fixing member.

BRIEF DESCRIPTION OF THE DRAWINGS

The objects, features and advantages of the present invention will be more apparent from the following detailed description in conjunction with the accompanying drawings, in which.

DETAILED DESCRIPTION OF THE INVENTION

Hereinafter, embodiments of the present invention will be described in detail with reference to the accompanying drawings.

Figure 1:
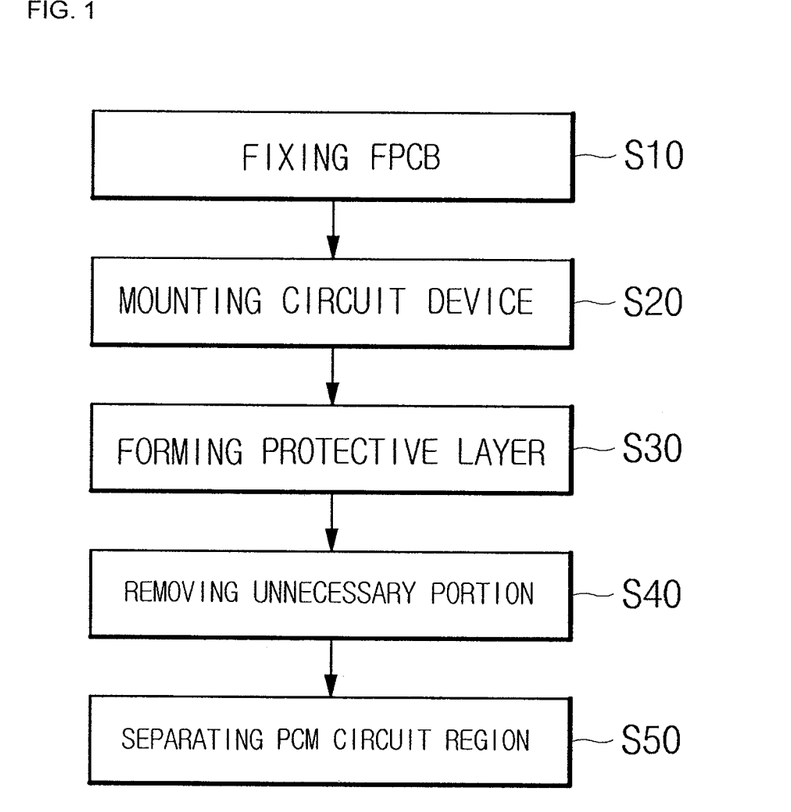
FIG. 1 is a flowchart illustrating a method of manufacturing a protection circuit module of a secondary battery according to an embodiment of the present invention.

FIG. 1 is a flowchart illustrating a method of manufacturing a protection circuit module of a secondary battery according to an embodiment of the present invention, and FIGS. 2 to 6 are perspective views illustrating respective steps of the method.

Referring to FIG. 1, the method of manufacturing a protection circuit module (PCM) of a secondary battery includes fixing a flexible printed circuit board (FPCB) (S10), mounting circuit devices to the FPCB (S20), forming a protective layer (S30), removing an unnecessary portion from the FPCB (S40), and separating the PCM (S50).

Figure 2:
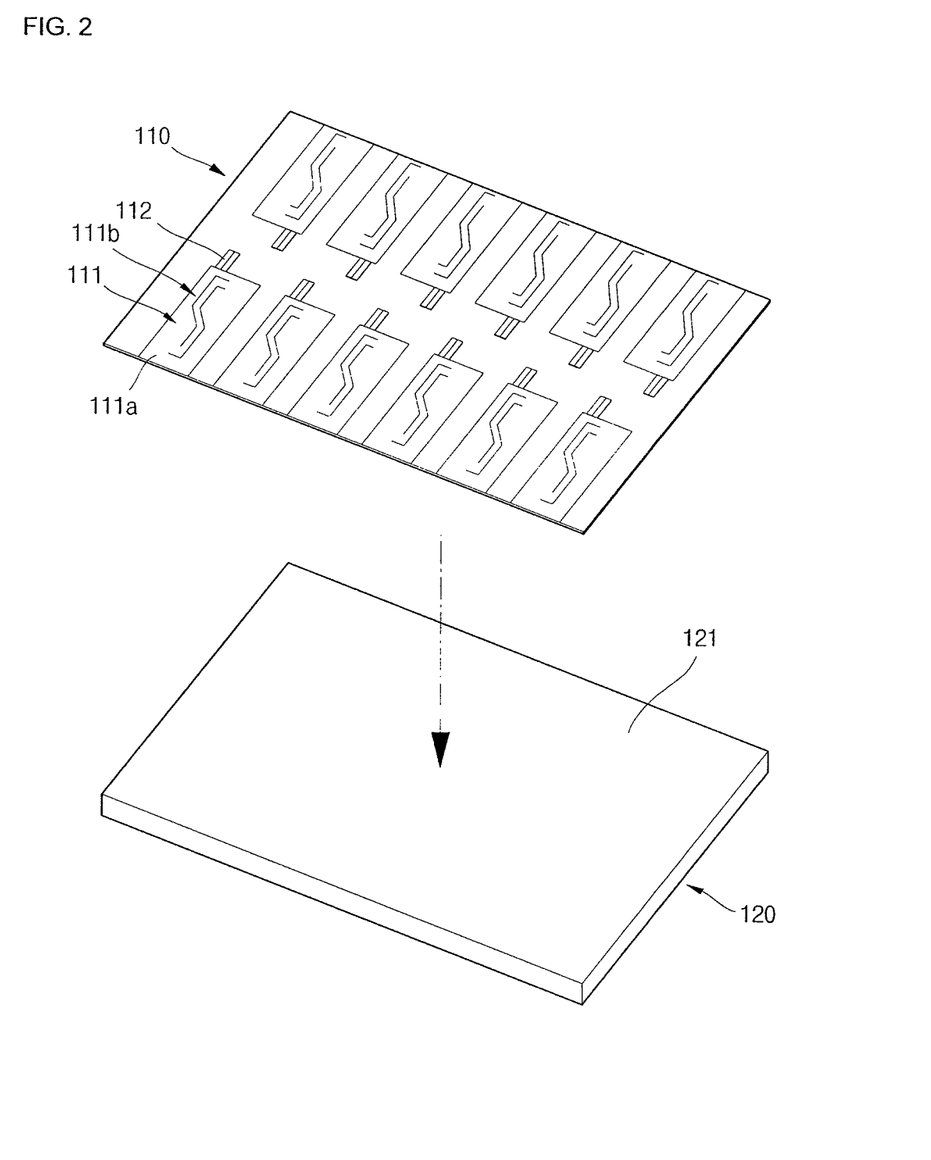
FIG. 2 is a perspective view illustrating a step of fixing a flexible printed circuit board as shown in FIG. 1.

FIG. 2 is a perspective view illustrating the step of fixing an FPCB (S10) as shown in FIG. 1. Referring to FIG. 2, the FPCB 110 is fixed to a fixing member 120. The FPCB 110 has a plurality of unit pattern forming regions 111 having the same configuration. Each of the unit pattern forming regions 111 includes a main body 111a to which a circuit device is mounted and an external terminal 112 extending from the main body 111a. Although not depicted, copper foil wiring patterns are formed in the main bodies 111a to electrically connect various circuit devices to be mounted to the main bodies 111a and to be connected to the external terminals 112 and later-forming internal terminals 114. In the embodiment of the present invention, the FPCB with a thickness of about approximately 0.1 mm is used, but the present invention is not limited thereto.

The fixing member 120 has a plate shape and a flat fixing surface 121 to which the FPCB 110 is attached. The fixing surface 121 has approximately the same shape as that of the FPCB 110 and is equal to or greater than the FPCB 110 in size. The FPCB 110 may be fixed to the fixing surface 121 of the fixing member 120 by various fixing means such as adhesive, a dual-sided tape, and the like.

Figure 3A:
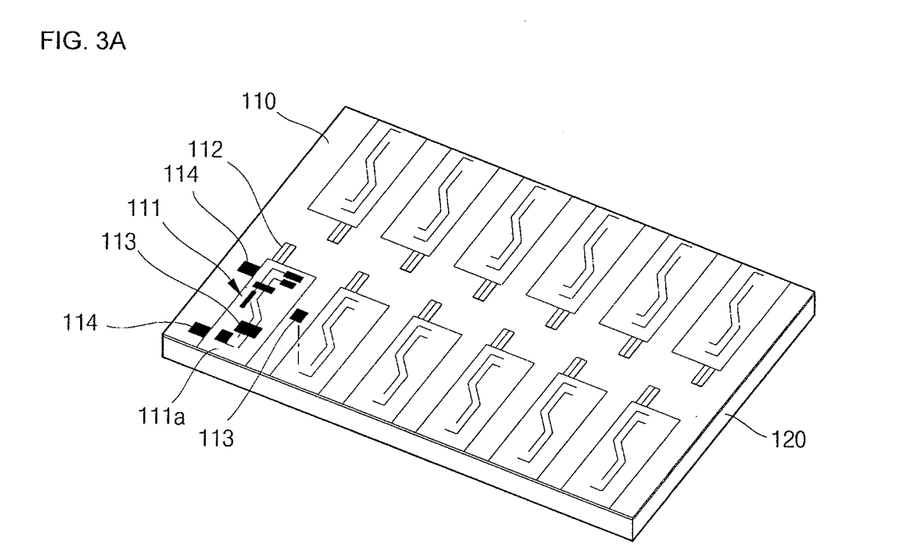
FIG. 3A is a perspective view illustrating a step of mounting circuit devices as shown in FIG. 1.
Figure 3B:
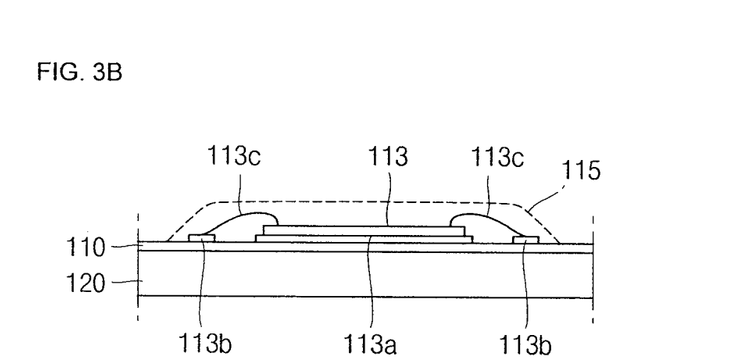
FIG. 3B is a detail view illustrating a chip mounted during the mounting as shown in FIG. 3A.

FIG. 3A is a perspective view illustrating the step of mounting a circuit device (S20), FIG. 3B is a side view illustrating a detailed status wherein a die type circuit device is mounted. Referring to FIG. 3A, various circuit devices 113 necessary for the protection circuit module (PCM) are mounted to each of the main bodies 111*a* of the unit pattern forming regions 111 of the FPCB 110. Although not depicted in detail, the circuit devices 113 employed in the PCM includes a control IC, a switching device such as a field effect transistor (FET), and various passive components such as a resistor, a capacitor, and the like. In this embodiment, the control IC and the switching device are die type chips cut off a wafer. When the die type chip is used, a thickness of the PCM can be reduced. The wiring patterns of the chips and main body may be electrically connected to each other by the connection of wire bonding as shown in FIG. 3B.

Referring to FIG. 3B, the chips 113 are mounted to the FPCB 110 such that sides of the chips 113 in which terminals are formed direct upward. A thickness of the chips 113 is about approximately 0.22 mm. The chips 113 are coupled on the FPCB 110 by die bonding pads 113 formed on the FPCB 110. The die bonding pads 113*a* are formed by coating an adhesive substance on the FPCB 110. In this embodiment, epoxy resin, thermal conductive resin, or resin containing thermal conductive particles is used as the die bonding pads 113*a* to sufficiently emit heat generated from the chips 113. The die bonding pads have a thickness of about approximately 0.03 mm. Wire bonding pads 113*b* are provided surrounding the die bonding pads 113*a* to be apart therefrom. The wire bonding pads 113*b* are formed by plating gold to the copper foil formed on the FPCB 110. The wire bonding pads 113*b* are electrically connected to wires 113*c* by the wire bonding. The wires 113*c* are electrically connected to terminals of the chips 113 by the wire bonding. When the respective wires 113*c* are connected to terminals formed on the upper side of the chips 113, upper ends of the wires 113*c* protrude over the chips 113 by about approximately 0.1 mm. Although the wires 113 are made of gold in this embodiment, the present invention is not limited thereto. The wires 113*c* may be made of copper having excellent conductivity.

The mounting of the die type chips 113 as illustrated in FIG. 3B are formed by forming the die bonding pads 113*a* on the FPCB 110, attaching the chips 113*a* on the die bonding pads 113*a*, and electrically connecting the chips 113 to the FPCB 110.

Conductive plates are mounted to a side of each of the main bodies 111*a* to form two internal terminals 114. The internal terminals 14 protrude from each of the main bodies 111*a*. Although not depicted, the internal terminals 114 are electrically connected to two electrodes of a bare cell supplying electric energy. Although not depicted in detail, the internal terminals 114 are electrically connected to the copper foil wiring patterns formed on the main bodies 111*a*. Each of PCM circuit regions 111*b* is formed by mounting the circuit device 113 and the two internal terminals 114 in each of the unit pattern forming regions 111. Thus, each of the PCM circuit regions 111*b* includes the main body 111*a* to which a plurality of circuit devices 113 are mounted and the wiring pattern is formed, and the external terminal 112 and the internal terminals 114 protruding outwardly from the main body 111*a*.

Figure 4A:
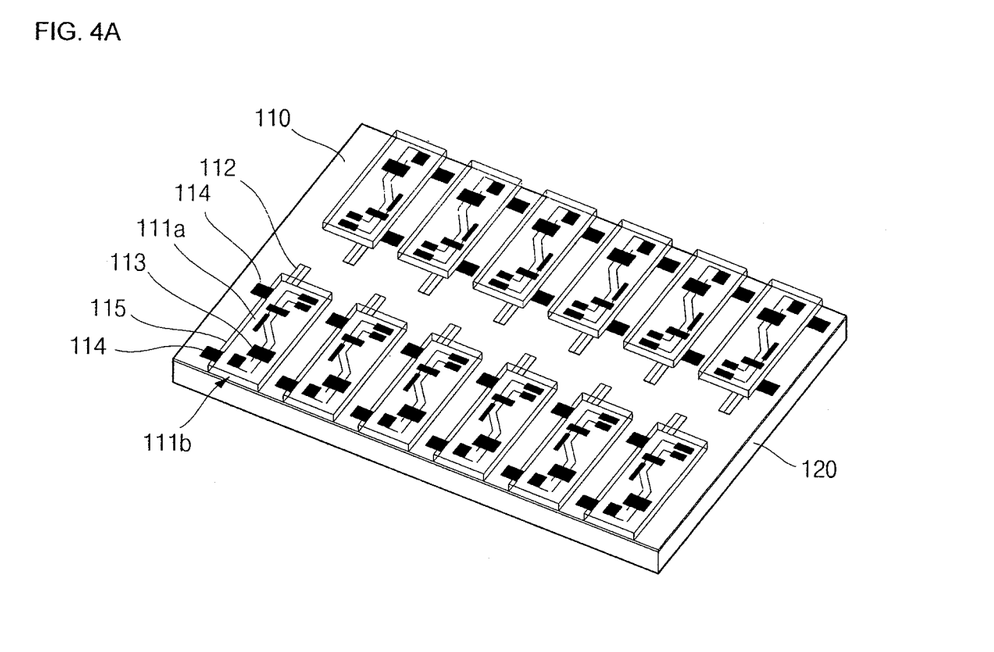
FIGS. 4A and 4B are views illustrating a step of coating a protective material as shown in FIG. 1.
Figure 4B:
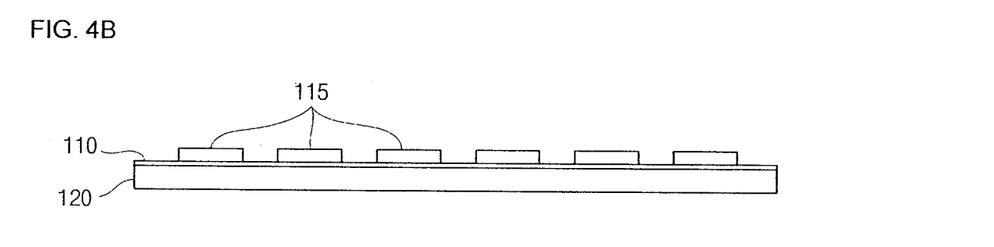

FIGS. 4A and 4B are a perspective view and a side view respectively illustrating the step of forming a protective layer (S30) as shown in FIG. 1. Referring to FIGS. 4A and 4B, protective layers 115 are formed on the FPCB 110 to cover the main bodies 111*a* of the respective PCM circuit regions 111*b*. The circuit devices 113 are accommodated in the protective layers 115, respectively. The protective layers 115 are made of an insulation substance, preferably epoxy resin, silicon compound or combinations thereof. In this embodiment, the protective layers are formed by dropping liquid epoxy resin or liquid silicon compound and hardening the same in the formation of the protective layer (S30). Tops of the protective layers 115 are about approximately 0.05 mm higher than the upper ends of the wires 113*c* (See FIG. 3B). Thus, the tops of the protective layers 115 protrude from the FPCB 110 by about approximately 0.4 mm. Therefore, since overall thickness of the FPCB 110 with a thickness of about approximately 0.1 mm and the protective layers 115 is about approximately 0.5 mm, the thickness of the PCM according to the embodiment of the present invention is remarkably reduced to be less than that of the existing PCM having a PCB with a thickness of about approximately 0.5 mm. In other words, a thickness of the FPCB 110 is about approximately 0.1 mm, thicknesses of the die bonding pads 113*a* formed on the FPCB 110 are about approximately 0.03 mm, thicknesses of the chips 113 mounted to the die bonding pads 113*a* are about approximately 0.22 mm, the wires 113*c* rise about approximately 0.1 mm higher than the chips 113, and the tops of the protective layers 115 are about approximately 0.05 mm higher than the upper ends of the wires 113*c*. Thus, the overall thickness containing the FPCB 110 and the protective layers 115 may become thinner by about approximately 0.5 mm. The protective layers 115 insulate the portion accommodated therein from the exterior and prevent the wires from being shorted or cut off due to external shock.

Although the drawings illustrate that all circuit devices 113 are covered with the protective layers 115, the present invention is not limited thereto. As illustrated in FIG. 3B, the active components such as the control IC chips, the switching devices, and the like only may be covered with the protective layers 115, and the passive components such as resistors, capacitors, and the like may not be covered with the protective layers 115. When the passive components such as resistors, capacitors, and the like are also coated, thin protective layers 115 are widely formed and the circuit devices may be easily damaged. Thus, when only the active components such as control IC chips, switching devices, and the like are coated with the protective layers 115, the possibility of damage of the protective layers 115 can be reduced.

Figure 5A:
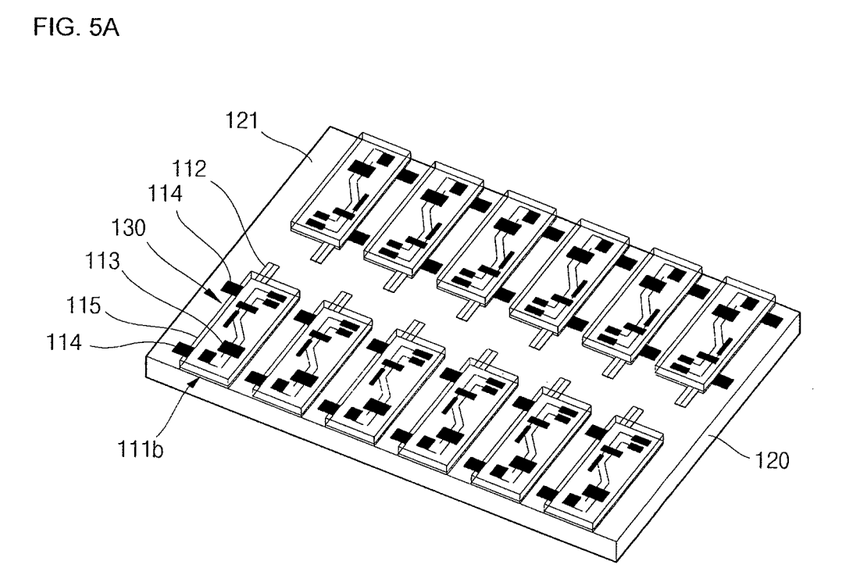
FIGS. 5A and 5B are views illustrating a step of removing an unnecessary portion as shown in FIG. 1.
Figure 5B:
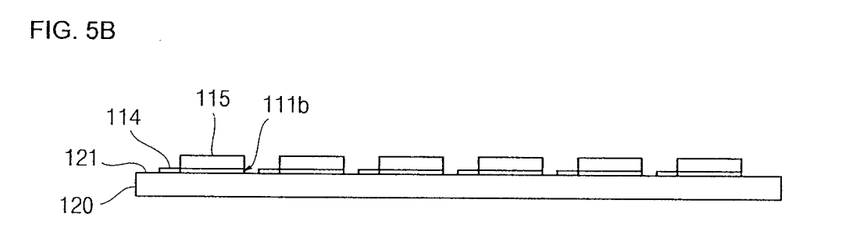

FIGS. 5A and 5B are a perspective view and a side view respectively illustrating the step of removing an unnecessary portion (S40) as shown in FIG. 1. Referring to FIGS. 5A and 5B, the unnecessary portion is cut off the FPCB 110 (See FIG. 4A) to be removed. The unnecessary portion mentioned in this embodiment of the present invention means a portion except for the PCM circuit regions 111*b* of the FPCB 110 (See FIG. 4A). The respective PCM circuit regions 111*b* are portions substantially serving as a PCM of a secondary battery. The removal of the unnecessary portion (S40) may not be performed as the occasion demands. In other words, the separation of the PCM circuit regions (S50) may be performed directly after the formation of the protective layers (S30).

Figure 6:
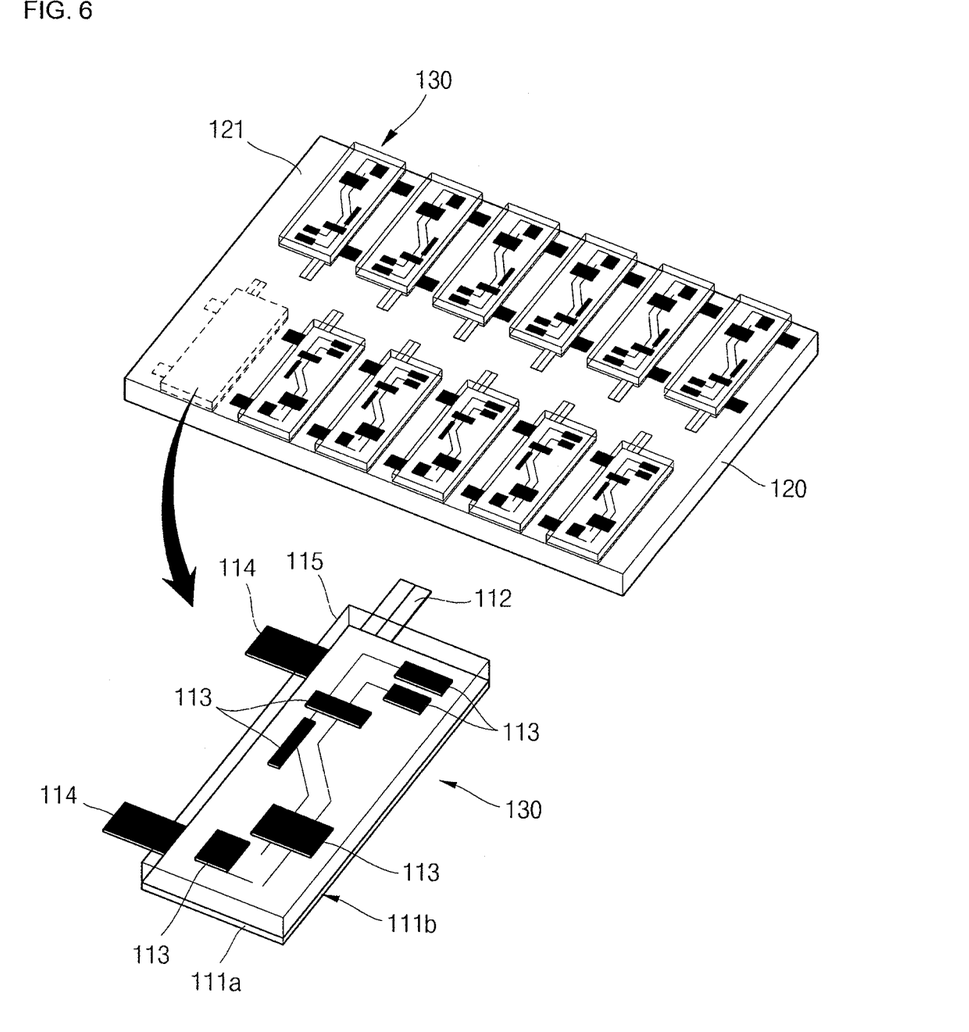
FIG. 6 is a view illustrating a step of separating the protection circuit module as shown in FIG. 1.

FIG. 6 is a perspective view illustrating a separation of the PCM circuit regions (S50) as shown in FIG. 1. Referring to FIG. 6, in the separation of the PCM circuit regions (S50), the respective PCM circuit regions 111b are separated from the fixing member 120. Each of the separated PCM circuit regions 111b serves as a PCM 130 of a secondary battery. Each of the PCMs 130 includes a main body 111a to which a copper foil wiring pattern is formed and various circuit devices 113 are mounted, a protective layer 115 covering the main body 111a and accommodating the various circuit devices 113 therein, and external terminals 112 and internal terminals 114 respectively extending from the main body 111a.

Although exemplary embodiments of the present invention have been described in detail hereinabove, it should be understood that many variations and modifications of the basic inventive concept herein described, which may appear to those skilled in the art, will still fall within the spirit and scope of the exemplary embodiments of the present invention as defined by the appended claims.

What is claimed is:

1. A method of forming a plurality of protection circuit modules (PCMs) for a battery, the method comprising:
    positioning a flexible printed circuit board (FPCB) on a fixing surface wherein the FPCB includes a plurality of unit pattern forming regions that each define a main body and an external terminal;
    positioning chip circuit devices on the main body of the unit pattern forming regions of the FPCB so that a plurality of PCMs can be formed on the FPCB;
    connecting one or more internal terminals to the FPCB;
    positioning a protective layer over at least a portion of the FPCB so as to cover at least some of the components of the PCMs formed on the FPCB; and
    separating the FPCB from the fixing surface after the chip circuit devices and protective layer has been positioned on the FPCB so as to separate a plurality of individual PCMs from the fixing surface,
    wherein the one or more internal terminals are configured to be connected to one or more electrodes of a bare cell supplying electrical energy so that the internal terminals extend outward from the main body of the FPCB to a direction away from the protective layer and extend over an edge of the FPCB.

2. The method of claim 1, wherein the FPCB is fixed to the fixing surface via adhesive or dual sided tape.

3. The method of claim 1, wherein the chip circuit devices are active circuit devices that are die bonded to the main body of the FPCB so that the terminals of the active circuit devices are on a surface that is positioned away from the interface between the active circuit devices and the main body of the FPCB.

4. The method of claim 3, wherein the chip circuit devices are die bonded to the FPCB by coating an adhesive substance on the FPCB at the interface between the one or more active circuit devices and the main body.

5. The method of claim 4, wherein the adhesive substance at the interface between the one or more active circuit devices and the main body comprises a thermal conductive resin or a resin containing thermal conductive particles.

6. The method of claim 3, further comprising:
    forming wire bond pads on the FPCB and
    electrically interconnecting the terminals of the active devices to the wire bond pads via wire bonding.

7. The method of claim 6, wherein the terminals of the active device on the chip circuit devices are wire boded to the wire bonding pads so that the wire bonds are less than approximately 0.1 mm above an upper surface of the chip circuit devices.

8. The method of claim 6, wherein FPCB comprises copper foil and the wire bond pad is formed by plating gold onto the copper foil.

9. The method of claim 1, wherein positioning a protective layer over at least a portion of the FPCB comprises positioning the protective layer over the main bodies of the FPCB that include active circuit components.

10. The method of claim 9, wherein positioning a protective layer over at least a portion of the FPCB comprising positioning the protective layer over the FPCB so that the height of the protective layer is less than approximately 0.15 mm above the upper surface of the chip circuit devices.

11. The method of claim 9, wherein positioning the protective layer over the main bodies of the FPCP comprises respectively positioning a plurality of protective layers over at least a portion of each of the plurality of main bodies of the FPCB.

12. The method of claim 11, wherein positioning the protective layer over at least a portion of each of the plurality of main bodies of the FPCB comprises positioning a protective layer so that the active circuit components of the main bodies of the FPCB are covered and so that other circuit components of the main body are not covered.

13. The method of claim 1, wherein the protective layer comprises an electrically insulative resin.

14. The method of claim 13, wherein positioning a protective layer over at least a portion of the FPCB comprises depositing a liquid epoxy resin or a liquid silicon compound on the FPCB and hardening the liquid epoxy resin or the liquid silicon compound.

15. The method of claim 1, further comprising removing one or more unnecessary portion of the FPCB prior to separation of the FPCB from the fixing member.

* * * * *

UNITED STATES PATENT AND TRADEMARK OFFICE
CERTIFICATE OF CORRECTION

PATENT NO. : 8,966,749 B2  
APPLICATION NO. : 12/510143  
DATED : March 3, 2015  
INVENTOR(S) : Bong Young Kim Page 1 of 1

It is certified that error appears in the above-identified patent and that said Letters Patent is hereby corrected as shown below:

In the Specification

In column 1 at line 8 (approx.), Change "61/109094," to --61/109,094,--.

In the Claims

In column 5 at line 36 (approx.), In Claim 1, change "the components" to --components--.

In column 6 at line 16 (approx.), In Claim 7, change "boded" to --bonded--.

In column 6 at line 32 (approx.), In Claim 11, change "FPCP" to --FPCB--.

Signed and Sealed this  
Fifth Day of January, 2016

Michelle K. Lee  
*Director of the United States Patent and Trademark Office*